Figure 1:
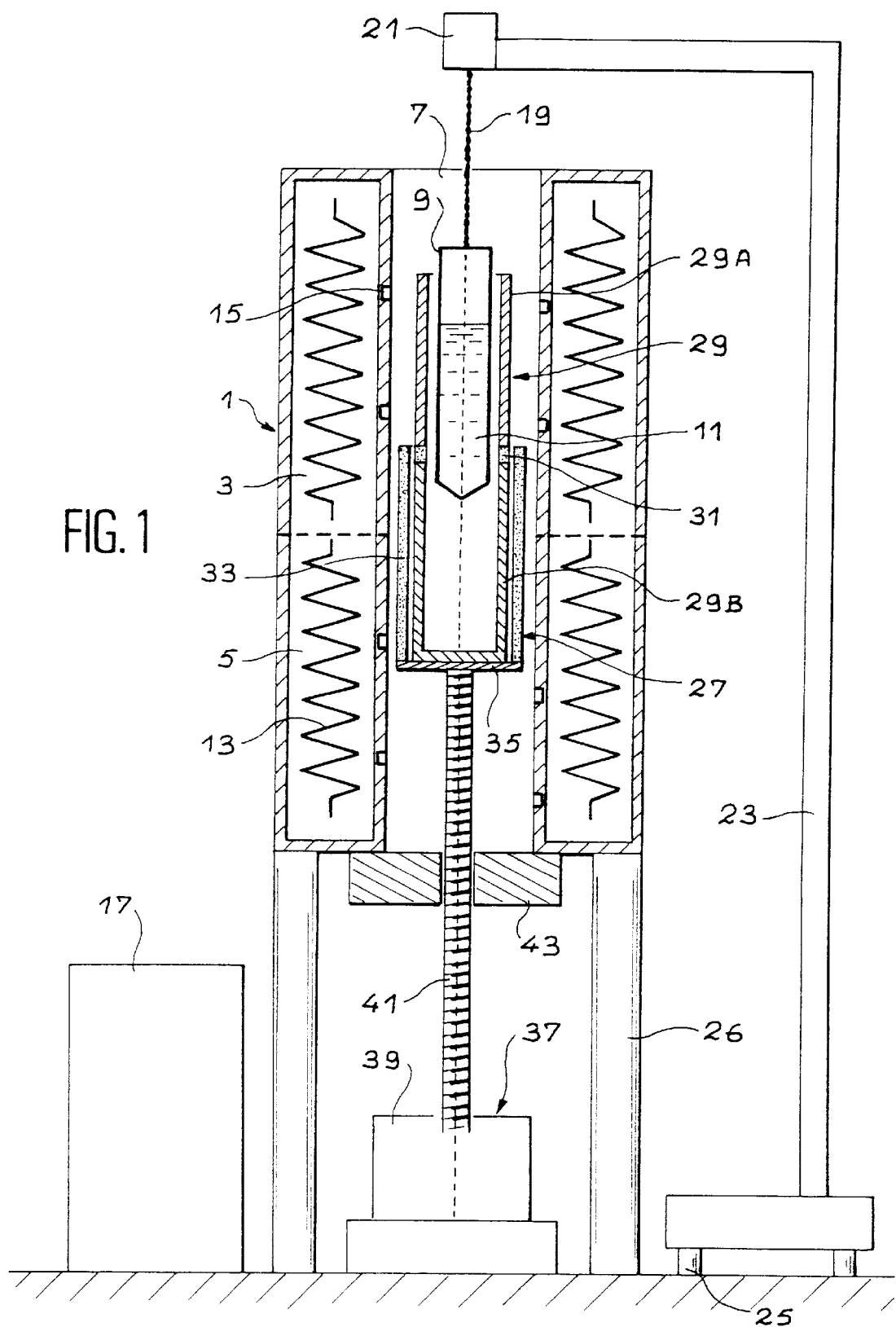

United States Patent

Petroz

US005772761A

[11] Patent Number: 5,772,761
[45] Date of Patent: Jun. 30, 1998

[54] CRYSTALLIZATION FURNACE FOR MATERIAL WITH LOW THERMAL CONDUCTIVITY AND/OR LOW HARDNESS

[75] Inventor: Gérard Petroz, Montbonnot, France

[73] Assignee: Commissariat a l'Energie Atomique, Paris, France

[21] Appl. No.: 747,155

[22] Filed: Nov. 8, 1996

[30] Foreign Application Priority Data

Nov. 23, 1995 [FR] France .................................. 95 13934

[51] Int. Cl.$^6$ .................................................. C30B 35/00
[52] U.S. Cl. ........................... 117/206; 117/204; 117/900
[58] Field of Search ................................ 117/81, 82, 83, 117/200, 202, 204, 206, 900; 432/45, 210, 262

[56] References Cited

U.S. PATENT DOCUMENTS

| | | | |
|---|---|---|---|
| 4,190,486 | 2/1980 | Kyle .......................................... | 117/81 |
| 4,197,273 | 4/1980 | Dusserre et al. ......................... | 117/202 |
| 5,169,486 | 12/1992 | Young et al. .............................. | 117/83 |

FOREIGN PATENT DOCUMENTS

| | | | |
|---|---|---|---|
| 2352587 | 12/1977 | France . | |
| 360141695A | 7/1985 | Japan ...................................... | 117/81 |
| 362059592A | 3/1987 | Japan ...................................... | 117/81 |
| 1545966 | 5/1979 | United Kingdom . | |
| 2262707 | 6/1993 | United Kingdom . | |

OTHER PUBLICATIONS

Journal of Crystal Growth, vol. 47, No. 3, Sep. 1979, Amsterdam NL, pp. 449–457, Le Gal et al., "Crystal growth by the thermic screen translation technique . . . ".

Journal of Crystal Growth, vol. 21, Jan. 1974, Amsterdam NL, pp. 135–140, Chang et al., "Control of interface shape in the vertical bridgman stockbarger technique".

Patent Abstracts of Japan, vol. 18, No. 625 (C–1279), Nov. 29, 1994, & JP–A–62 039685 (Kawatetsu Mining Co. Ltd.).

Primary Examiner—Felisa Garrett
Attorney, Agent, or Firm—Pearne, Gordon, McCoy and Granger LLP

[57] ABSTRACT

The invention concerns a crystallization furnace for a material with low thermal conductivity arid/or low hardness.

This furnace can obtain high quality single crystals.

This furnace comprises a heating chamber (1), heating means (13) to create a temperature profile along the center line of said chamber and thus define at least one heating zone (3), and at least one cooling zone (5) and a crucible (9) filled with a solution of a solute to be crystallized in a solvent, said crucible (9) being fixed and placed in the heating chamber (1) in the heating zone (3), characterized in that the furnace also comprises:

a crystallization device (27) comprising a temperature homogenizer (29A) and a heat sink (29B) separated by a thermally insulating spacer (31), said temperature homogenizer, heat sink and insulating spacer being rigidly attached to each other, and means (37) of displacing said crystallization device (27) along the center line of the chamber and around said crucible (9).

12 Claims, 4 Drawing Sheets

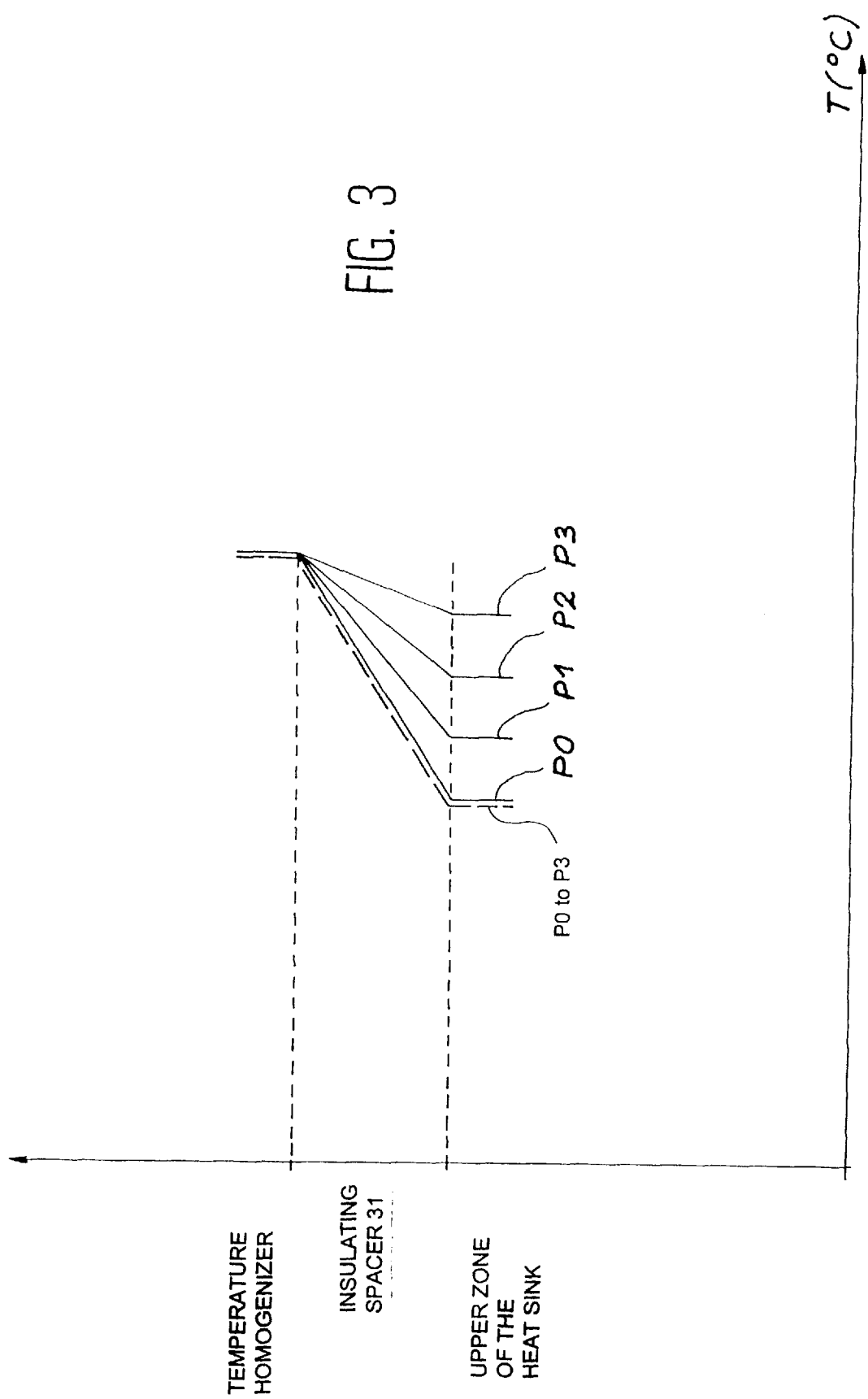

CRYSTALLIZATION FURNACE FOR MATERIAL WITH LOW THERMAL CONDUCTIVITY AND/OR LOW HARDNESS

DESCRIPTION

This invention concerns a crystallization furnace designed for making single crystals of a material with low thermal conductivity and/or low hardness.

The furnace according to the invention is applicable particularly for making single crystals using the so-called "BRIDGMAN" method, by which a solution comprising a solute dissolved in a solvent is cooled in accordance with a thermal gradient, in order to provoke controlled solidification of this solute. The success of the metallurgical operation depends on how well the thermal gradient is controlled. However, the crystallization furnace according to the invention may also be used for other ways of making single crystals, particularly for purification by liquefaction and recrystallization.

The BRIDGMAN method uses a BRIDGMAN furnace. This furnace can be used to create one or several thermal gradients by putting individually controlled heating areas adjacent to each other, and which include a heating adjustment system. This BRIDGMAN furnace comprises a heating chamber, heating means to set up a temperature profile along the center line of said chamber and thus define at least one hot area and one cold area, and finally a crucible filled with a solution of the solute to be crystallized. The term "cold area" means that the temperature in this area is less than the temperature in the "hot area", but it is nevertheless a heating area.

The open or closed crucible containing the liquid is moved from the top towards the bottom of the vertical chamber, from the hot zone towards the cold zone, which causes solidification and crystallization of the material.

In general, this furnace is supported on a frame that comprises a vertical crucible translation device, and possibly a rotation device, and an electricity power supply and control assembly. The internal configuration of the furnace and the materials used for making the crucible and the chamber, may differ depending on the nature of the product to be crystallized. An example of this type of furnace is described in document GB 1 545 966 written by the applicant.

The invention particularly, but not exclusively, concerns the production of single crystals of a material without any physical characteristics conducive to obtaining high quality crystals. Thus if the hardness of a material is low at ambient temperature, it is easy to understand that the crystalline network at the crystallization temperature is very brittle and that any type of vibration will cause defects in the solid which reduce the crystal quality obtained. Mosaic forms, twin crystals, sub-grains, dislocations of the crystalline network, or even grains with a different orientation, are thus observed. Consequently, the yield obtained for these crystals, the reproducibility of the process used and the intrinsic quality of the crystals obtained may be very variable.

Furthermore, some materials have another characteristic, namely their low thermal conductivity, that is not conducive to good solidification, i.e. in which single crystals are generated in sufficient quantities and with sufficient quality. When the liquid solidifies, this creates heat at the crystal growth interface that must be eliminated sufficiently quickly, particularly by the solid. Low thermal conductivity tends to create a concave growth front that will result in a poor quality single crystal. It is therefore necessary to eliminate crystal solidification heat, while respecting thermal gradients adapted to crystal formation.

For example materials based on manganese, titanium, bismuth, selenium, tellurium and rare earths such as gadolinium and samarium usually have low hardness at ambient temperature and/or poor thermal conductivity.

The various known methods of obtaining high quality crystals are not very reliable. For example, there are the results obtained in the article written by G. T. NEUGEBAUER et al., SPIE-The International Society for Optical Engineering, vol. 2228, 1–10.

The purpose of the invention is to develop a crystallization furnace that can very significantly increase the yield, reproducibility and quality of the single crystals obtained.

Consequently, the invention relates to a crystallization furnace for a material with low thermal conductivity and/or low hardness, comprising a heating chamber, heating means to set up a temperature profile along the center line of said chamber and thus define at least one hot zone and at least one cold zone, and a crucible filled with a solution of the solute to be crystallized, in a solvent. This furnace may be vertical or horizontal.

Said crucible is fixed and is placed in the heating chamber in the heating zone. According to the characteristics of the invention, the furnace also includes:

a crystallization device comprising a temperature homogenizer and a heat sink separated by a thermally insulating spacer, said temperature homogenizer, heat sink and insulating spacer being attached to each other, and means for moving said crystallization device along the center line of the chamber and around said crucible.

This crucible is preferably installed on an anti-vibration device.

Since the crucible is static and is placed on anti-vibration studs, all vibrations which induce firstly mechanical stresses on the crystal during solidification, and secondly thermal fluctuations at the solid-liquid interface, can be completely eliminated. Thus, a single crystal with perfect quality is obtained.

Furthermore, the temperature homogenizer homogenizes the temperature of the liquid present in the crucible, the thermally insulating spacer creates the temperature gradient necessary for crystallization of the material, and finally the heat sink eliminates heat radiated by the solid fraction of the crystal towards the bottom, by conduction.

Furthermore, the crystallization device may also comprise a thermally insulating tubular shield coaxial with the temperature homogenizer and the heat sink, and surrounding the heat sink and the insulating spacer. This type of shield improves the action of the heat sink.

Beneficially, the bottom of the heat sink is made of a heat conducting material.

Due to this characteristic of the invention (and particularly when the furnace is vertical) the liquid is retained, particularly in the heat sink, if the crucible breaks. Therefore, the heating chamber of the furnace itself is protected. In earlier designs of furnaces, the inside of the chamber was protected by a guard tube usually made of quartz or alumina. The presence of this guard tube, which is usually also a thermal insulator, makes it necessary to increase the power of the furnace by up to 10% of the useful value in the solution proposed by the invention. Therefore the invention can significantly increase the useful power of the furnace, and can increase the crucible diameter/furnace chamber diameter ratio.

Therefore, larger crystals can be made for the same furnace diameter. The confinement thus made around the crucible then very significantly reduces gas convection movements responsible for temperature variations harmful to uniform crystallization. In particular, the chimney effect in most conventional furnaces is considerably reduced.

According to one alternative embodiment, the heating chamber is closed and filled with a gas circulating at low flow, this gas being chosen from among an inert gas, a reducing or oxidizing gas, or a gas containing a doping product in the gaseous state.

This can very significantly reduce natural gas convection movements, improve heat exchanges in the chamber and treat materials that are sensitive to air.

Figure 2A:
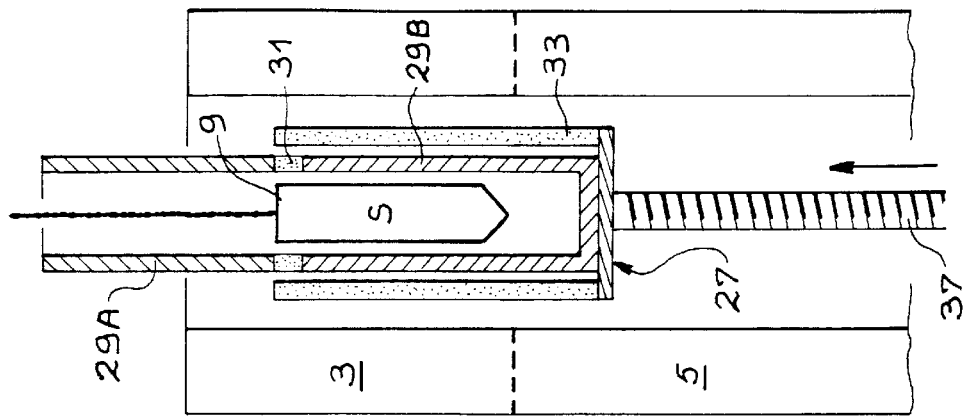
Figure 2B:
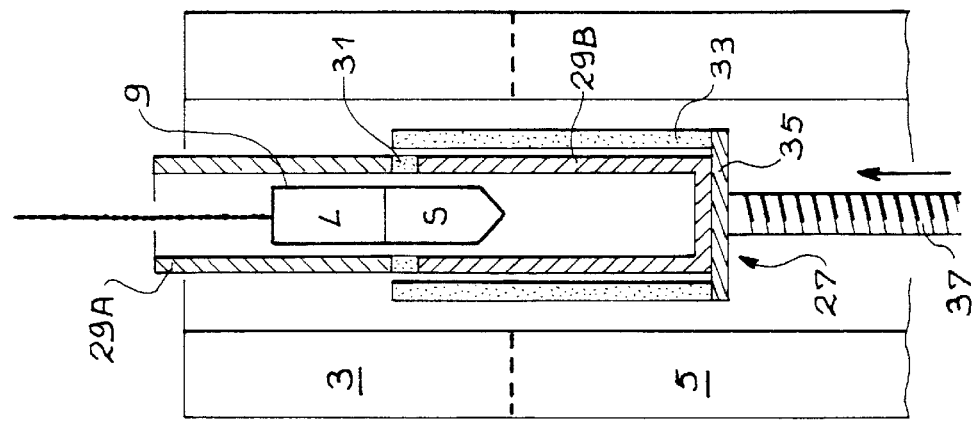
Figure 2C:
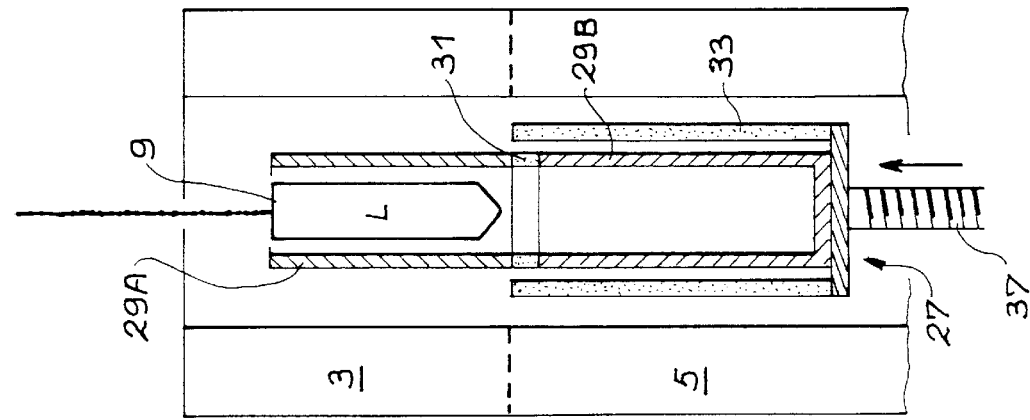
Figure 4:
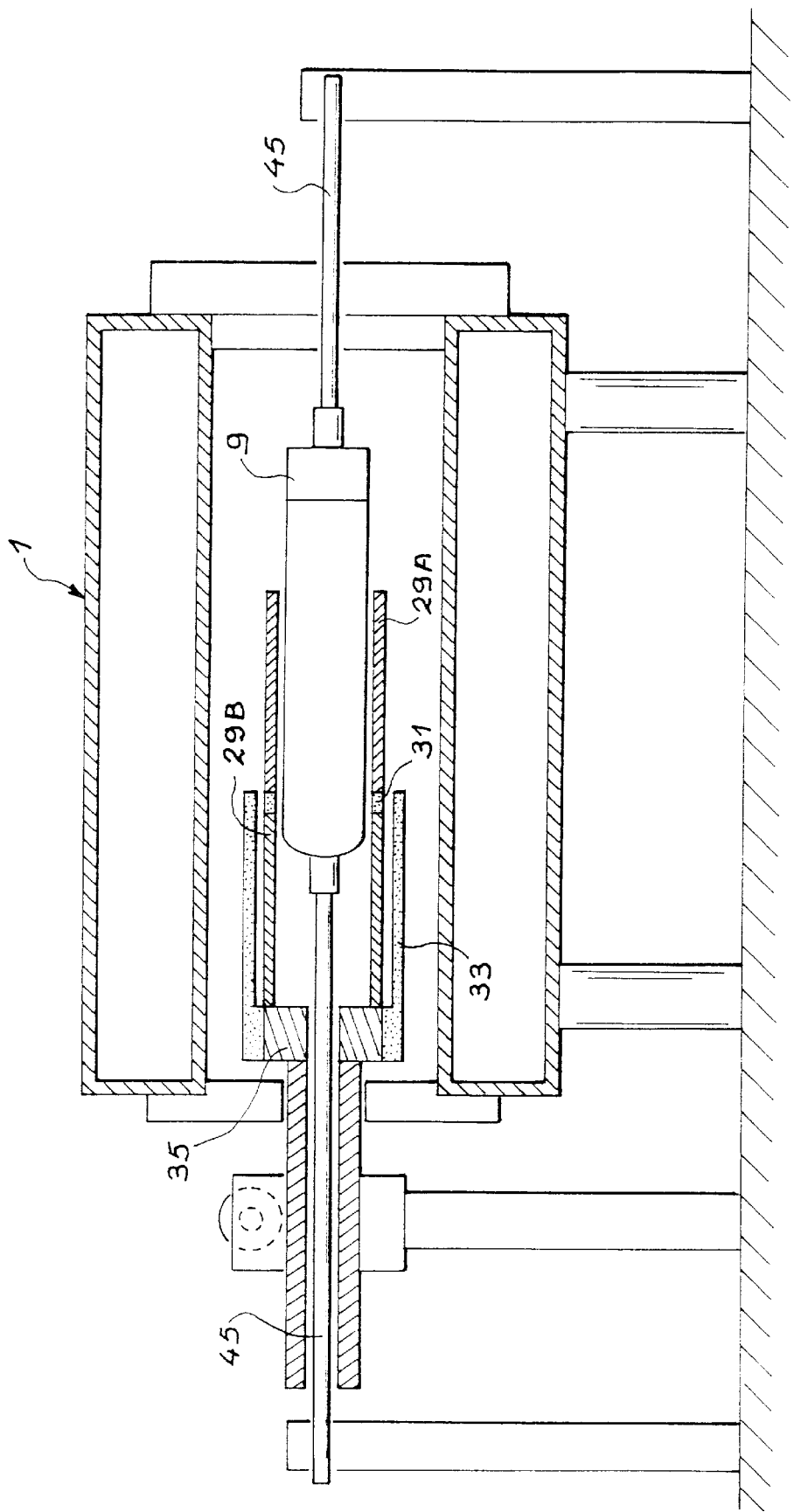

The invention will be better understood reading the following description of two preferred embodiments of the invention given as illustrative and non-limiting examples, this description being made with reference to the attached drawings in which:

FIG. 1 is an overall drawing of the crystallization furnace according to a first embodiment of the invention, FIGS. 2A, 2B and 2C are drawings representing operation of the crystallization furnace in accordance with the invention, FIG. 3 is a graph showing temperatures at the various points of the temperature homogenizer, the heat sink and the insulating spacer as a function of the movement of the crystallization device according to the invention, and FIG. 4 is a drawing of a second embodiment of the furnace.

As shown in FIG. 1, the crystallization furnace according to the invention comprises a heating chamber 1, including at least one hot zone 3 and one cold zone 5. The walls of the heating chamber 1 delimit a central cavity 7 in which there is a crucible 9 filled with a solution of the solute to be crystallized 11. The walls of the chamber are equipped with heating means 13 usually consisting of electric heating resistors. Furthermore, these walls also include temperature sensors 15, usually consisting of thermocouples and which are used to regulate and control the required thermal gradient inside the crystallization furnace. These temperature sensors are usually placed on the inside surface of the furnace.

The crystallization furnace also includes instrumentation means and an electricity power supply 17 connected to electrical resistors 13 and temperature sensors 15, this link not being shown on FIG. 1 for simplification purposes.

Crucible 9 is suspended inside the heating chamber 1 by means of a cable 19, but this cable can be replaced by any other equivalent rod or chain type of device. This cable 19 is connected to a device 21 providing fine adjustment of the crucible position inside the heating chamber. This device 21 very precisely controls movement and centering of the crucible inside the chamber. The device 21 is mounted on bracket 23, itself fitted with anti-vibration studs 25 designed to prevent any vibration of the crucible and therefore reduce the risks of dislocation or the occurrence of grains with a different orientation in the crystal being formed during the crystallization step.

The furnace heating chamber 1 is placed on a support 26.

The furnace according to the invention also comprises a crystallization device 27. This crystallization device comprises a temperature homogenizer 29A and a heat sink 29B separated by a thermally insulating spacer 31, said temperature homogenizer, heat sink and insulating spacer being rigidly attached, and possibly a thermally insulating tubular shield 33. This shield is coaxial with the temperature homogenizer, the heat sink and the insulating spacer and surrounds the heat sink 29B and the insulating spacer 31.

The thermally insulating material of which spacer 31 and tubular shield 33 are made is chosen for example from alumina, zirconium and refractory cements.

Furthermore, according to an alternative embodiment, the heat sink 29B may have an enclosed bottom 35 made of a heat conducting material. This material is usually the same as the material used for the temperature homogenizer and the heat sink.

The crystallization device is fitted with displacement means 37 which move the crystallization device by translating it along the center line of the chamber and around the crucible 9. For example, these displacement means 37 may be a motor 39 and a worm 41, this worm being fitted on the bottom 35 of the crystallization device. These displacement means 37 may also consist of a piston.

According to one alternative embodiment, cooling means 43 may be provided for the worm 41, or more generally for the rod moving the crystallization device 27. This cooling device 43 is fitted around the worm or rod 41 outside the heating chamber 1. For example, this device may be composed of a coil filled with a cooling fluid.

We will now describe operation of the crystallization furnace according to the invention in more detail, with reference to FIGS. 2A, 2B and 2C.

FIG. 2A schematically shows part of the crystallization furnace before the furnace starts operation. Crucible 9 is placed in the furnace chamber so that it is located entirely in the hot zone 3. Furthermore, the crystallization device 27 is in the down position, i.e. the top end of the insulating ring 31 is below the bottom end of crucible 9. Only the temperature homogenizer 29A surrounds crucible 9. Consequently, the solution of the solute to be crystallized is in liquid form L. The temperature homogenizer 29A thermally homogenizes the liquid located in the crucible 9.

Under the action of the displacement device 37, the crystallization device 27 moves in translation towards the top part of the furnace chamber until it reaches the position shown on FIG. 2B. The liquid located in crucible 9 solidifies as the insulating spacer 31 passes in front of the crucible thus isolating it from the hot zone 3 of the furnace chamber. Therefore, on FIG. 2B, the entire lower part of the crucible is solidified (reference S). Furthermore, the heat sink 29B eliminates heat radiated by the solid fraction S of the material to be crystallized, by conduction towards the bottom of the chamber. The bottom 35 also participates in removing heat. The tubular shield 33 assists the insulating spacer 31 by forming an additional insulating thickness in its vicinity, and secondly improves the heat elimination role of the heat sink 29B by isolating this heat sink 29B from the hot zone 3.

FIG. 2C illustrates the position of the furnace crystallization device at the limit stop, when all the material present in the crucible is solidified. In this case, the insulating spacer 31 is located in the upper part of the crucible 9.

The lengths of the insulating spacer 33, the heat sink 29B and the tubular shield 33 are designed such that at the crystallization device limit stop, part of this tubular shield 33 and part of the heat sink 29B are located facing the cold zone 5, so that the heat sink 29B can continue to act as a heat sink.

It is beneficial if heating resistors 13 in the cold zone 5 are controlled by electrical control and supply means 17, such that the temperature of the cold zone 5 decreases with time as the crystallization device 27 moves forwards. The beneficial effects of this temperature drop are shown on the curves in FIG. 3.

FIG. 3 shows the temperature of the insulating spacer 31, the temperature homogenizer 29A and the heat sink 29B as a function of the four successive positions P0, P1, P2 and P3 occupied by the crystallization device as it moves inside the heating chamber 1. Positions P0 and P3 of the crystallization device correspond to the positions shown on FIGS. 2A and 2C respectively. Positions P1 and P2 are intermediate positions occupied by the crystallization device. The solid straight lines show the results varying with time observed without cooling of cold zone 5, and the dashed straight line shows the results obtained with cooling of zone 5.

The temperature homogenizer 29A remains facing hot zone 3 at all times, as the crystallization device moves. Consequently, its temperature remains constant with time.

The temperature of the heat sink 29B is measured at a point P located close to the insulating spacer 31. This temperature is relatively low (see curve P0) when the crystallization device is in the position shown in FIG. 2A, since this point P is facing the cold zone 5. However, as the heat sink 29B moves adjacent to the hot zone 3, the temperature of this point P increases (see curves P1, P2 and P3) since the heat sink 29B acts as a heat sink less and less.

Finally, the temperature of the insulating spacer decreases along its height, but increases globally when the crystallization device moves between positions P0 and P3.

However, if the cold zone 5 is continuously cooled, the temperature gradient remains stable when the crystallization device moves, as shown by the dashed straight lines in FIG. 3. The temperature difference between the temperature homogenizer 29A and the heat sink 29B is higher, which increases the heat sink role of part 29B.

The gradual cooling program of cold zone 5 with time may be replaced by the creation of several cold zones 5 in which the temperature, constant in each zone, decreases in each zone between the hot zone 3 of the furnace and the lower part of this furnace.

FIG. 4 illustrates an alternative embodiment of the invention in which the crystallization chamber is horizontal.

In this case, the heating chamber 1 is horizontal. The crucible 9 is held in position at its two ends by rods 45 which keep the crucible in the fixed horizontal position. The crystallization device 27 is identical to the device used in the embodiment in FIG. 1, except that the bottom 35 is perforated to allow the rod 45 to pass through.

I claim:

1. A crystallization furnace for a material with one of low thermal conductivity and low hardness, comprising a heating chamber (1), heating means (13) to set up a temperature profile along the center line of said chamber, and thus to define at least one hot zone (3) and at least one cold zone (5) and a crucible (9) filled with a solution of solute to be crystallized in a solvent, said crucible (9) being fixed and placed in the hot zone (3) in the heating chamber (1), characterized in that the furnace also includes: a crystallization device (27) comprising a temperature homogenizer (29A) and a heat sink (29B) separated by a thermally insulating spacer (31), said temperature homogenizer, heat sink and insulating spacer being rigidly attached, and means (37) for moving said crystallization device (27) along the center line of the chamber and around said crucible (9).

2. A crystallization furnace according to claim 1, characterized in that the heat sink (299) has a bottom (35) made of a heat conducting material.

3. A crystallization furnace according to claim 2, characterized in that said bottom (35) is made of silicon carbide, graphite or refractory alloys.

4. A crystallization furnace according to claim 1, characterized in that the spacer (31) is made of a thermal insulating material chosen from alumina, zirconia and refractory cements.

5. A crystallization furnace according to claim 1, characterized in that the homogenizer and the heat sink are made of silicon carbide, graphite or refractory alloys.

6. A crystallization furnace according to claim 1, characterized in that the cold zone (5) is gradually cooled as the crystallization device (27) moves inside the heating chamber (1).

7. A crystallization furnace according to claim 1, characterized in that it comprises a device providing fine adjustment (21) of the position of the crucible (9) inside the heating chamber (1).

8. A crystallization furnace according to claim 1, characterized in that the crucible (9) is mounted on an anti-vibration device (25).

9. A crystallization furnace according to claim 1, characterized in that the heating chamber (1) is closed and full of a gas.

10. A crystallization furnace according to claim 9, characterized in that the gas is an inert gas, a reducing or oxidizing gas, or a gas comprising a doping product in the gaseous state.

11. A crystallization furnace according to claim 1, characterized in that said crystallization device (27) also comprises a thermally insulating tubular shield (33) coaxial with the temperature homogenizer (29A) and the heat sink (29B) and the insulating spacer, and surrounding the he sink (29B) and the insulating spacer (31).

12. A crystallization furnace according to claim 11, characterized in that said tubular shield is made of a thermally insulating material chosen among alumina, zirconia and refractory cements.

* * * * *

UNITED STATES PATENT AND TRADEMARK OFFICE
CERTIFICATE OF CORRECTION

PATENT NO. : 5,772,761
DATED : June 30, 1998
INVENTOR(S) : Petroz

It is certified that error appears in the above-identified patent and that said Letters Patent is hereby corrected as shown below:

Item [57] Abstract, line 2, delete "arid/or" and insert --and/or--.

In the Claims:

Column 6, Line 10, delete "(299)" and insert --(29B)--.

Column 6, Line 45, delete "he" and insert --heat--.

Signed and Sealed this

Eighth Day of September, 1998

Attest:

BRUCE LEHMAN

Attesting Officer

Commissioner of Patents and Trademarks